US007534731B2

United States Patent
Reid et al.

(10) Patent No.: US 7,534,731 B2
(45) Date of Patent: May 19, 2009

(54) METHOD FOR GROWING A THIN OXYNITRIDE FILM ON A SUBSTRATE

(75) Inventors: Kimberly G. Reid, Austin, TX (US); Anthony Dip, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/694,643

(22) Filed: Mar. 30, 2007

(65) Prior Publication Data
US 2008/0242109 A1 Oct. 2, 2008

(51) Int. Cl.
*H01L 21/31* (2006.01)
*H01L 21/469* (2006.01)

(52) U.S. Cl. ............... 438/786; 438/777; 438/763; 438/770; 438/773; 438/775; 257/E21.267

(58) Field of Classification Search ............. 438/786, 438/777, 763, 770, 773, 775; 257/E21.267
See application file for complete search history.

(56) References Cited

U.S. PATENT DOCUMENTS

| | | | |
|---|---|---|---|
| 5,674,788 A | 10/1997 | Wristers et al. | |
| 5,808,398 A | 9/1998 | Stoffels et al. | |
| 5,939,763 A | 8/1999 | Hao et al. | |
| 5,998,270 A * | 12/1999 | Gilmer et al. | 438/287 |
| 6,001,694 A | 12/1999 | Shih et al. | |
| 6,248,628 B1 | 6/2001 | Halliyal et al. | |
| 6,436,848 B1 * | 8/2002 | Ramkumar | 438/777 |
| 6,450,116 B1 | 9/2002 | Noble et al. | |
| 6,649,537 B1 | 11/2003 | Reder et al. | |
| 6,683,010 B1 | 1/2004 | Lim et al. | |
| 6,692,249 B1 | 2/2004 | Beatty et al. | |
| 6,869,892 B1 | 3/2005 | Suzuki et al. | |
| 6,887,797 B2 * | 5/2005 | Buchanan et al. | 438/773 |
| 6,929,699 B2 | 8/2005 | Whitesell | |
| 6,939,756 B1 | 9/2005 | Chung et al. | |

(Continued)

OTHER PUBLICATIONS

Ellis, K.A. et al., Nitrous Oxide (N2O) Processing for Silicon Oxynitride Gate Dieletrics, IBM J. Res. Develop. vol. 43, No. 3, May 1999, pp. 287-300.

(Continued)

*Primary Examiner*—George Fourson
*Assistant Examiner*—John M Parker
(74) *Attorney, Agent, or Firm*—Wood, Herron & Evans, LLP

(57) ABSTRACT

A method for growing an oxynitride film on a substrate includes positioning the substrate in a process chamber, heating the process chamber, flowing a wet process gas comprising water vapor and a nitriding gas comprising nitric oxide into the process chamber. The wet process gas and the nitriding gas form a processing ambient that reacts with the substrate such that an oxynitride film grows on the substrate. In yet another embodiment, the method further comprises flowing a diluting gas into the process chamber while flowing the wet process gas to control a growth rate of the oxynitride film. In another embodiment, the method further comprises annealing the substrate and the oxynitride film in an annealing gas. According to embodiments of the method where the substrate is silicon, a silicon oxynitride film forms that exhibits a nitrogen peak concentration of at least approximately 6 atomic % and an interface state density of less than approximately $1.5 \times 10^{12}$ per cc.

19 Claims, 8 Drawing Sheets

U.S. PATENT DOCUMENTS

2006/0148179 A1*  7/2006  Wang et al. ................ 438/287

OTHER PUBLICATIONS

Dang, Sanjit Singh et al., Nitrous Oxide-Baesd Progressive Silicon Oxynitridation in Furnaces of Different Dimensions, Advanced Materials Research Laboratory, Department of Chemical Engineering, University of Illinois at Chicago, Chicago, IL 60607, Undated, 5 pages.

Babu, Naseer et al., Tunnel Oxide Growth on Silicon with "Wet Nitrous Oxide" Process for Improved Performance Characteristics, IEEE Electron Device Letters, vol. 27, Nov. 2006 pp. 881-883.

Tada, Y. et al., High Quality Ultra-Thin Gate Oxynitride Formation by Fast Ramp Verticle Furnace, 1999 RTP Conference, 8 pp.

* cited by examiner

METHOD FOR GROWING A THIN OXYNITRIDE FILM ON A SUBSTRATE

FIELD OF THE INVENTION

The present invention relates to semiconductor substrate processing and, more particularly, to a method for incorporating high concentrations of nitrogen into oxynitride films in conjunction with water vapor thermal oxidation.

BACKGROUND OF THE INVENTION

In the formation of integrated circuits on the surface of a semiconductor substrate, oxynitride films are frequently grown or deposited over the surface of a crystalline substrate such as silicon. Oxynitride films may have superior electrical properties, including high electron mobility and low electron trap density that are desirable for device operation in semiconductor applications. Advantages of nitrogen incorporation in a thin oxide film include: reduced boron penetration through a p-doped polysilicon gate, improved interfacial smoothness, increased in the dielectric constant of the oxynitride film, and improved barrier properties to prevent diffusion of metal oxides or metal gate materials into the underlying substrate. Several methods have been developed for forming oxynitride films for semiconductor applications and, following formation of these films on a substrate, oxynitride films are frequently annealed to further improve their material and electrical properties.

The ability to incorporate nitrogen during processing is of critical importance for device performance. In one example, a thin oxide film may be annealed in the presence of a nitrogen-containing gas, such as nitrous oxide ($N_2O$), ammonia ($NH_3$), nitric oxide (NO), and thermal and plasma nitrogen ($N_2$), at predetermined processing conditions to form an oxynitride film by nitrogen incorporation from the gas into the oxide film. However, one serious shortcoming associated with using current nitrogen sources is variability in nitrogen incorporation and difficulty in preventing nitrogen penetration into the substrate. Both of these shortcomings deteriorate performance of the resulting MOSFET. Other problems include unacceptable oxynitride thickness variations and variation in nitrogen concentration in the oxynitride films. In other words, current processing techniques result in batch to batch variability, which directly impacts the overall quality of the oxynitride film and any semiconductor device constructed with the oxynitride film.

There is thus a need for new methods that provide high nitrogen incorporation at controlled depths while providing a controlled rate of oxide growth. Also, what is needed is improved reliability of nitrogen incorporation and tailoring the concentration and location of nitrogen within the oxide film.

SUMMARY OF THE INVENTION

The present invention provides a method for growing an oxynitride film on a substrate. In one embodiment, the method includes positioning the substrate in a process chamber, heating the process chamber to a processing temperature, flowing a wet process gas comprising water vapor and a nitriding gas comprising nitric oxide (NO) into the process chamber. The wet process gas and the nitriding gas form a processing ambient such that an oxynitride film grows on the substrate.

In another embodiment, the method includes positioning the substrate in a process chamber, heating the process chamber to a processing temperature of at least 850° C., generating a wet process gas comprising water vapor external to the process chamber by combusting a hydrogen gas and an oxygen gas, and flowing the wet process gas, a nitrogen diluting gas, and a nitric oxide nitriding gas into the process chamber. A silicon oxynitride film is thereby formed on the substrate having a nitrogen peak concentration of greater than approximately 0.5.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION

Embodiments of the present invention relate to semiconductor substrate processing, and more particularly, to a method for growing an oxynitride film on semiconductor substrates. As is known in the art, oxide films grown on semiconductor substrates are utilized in semiconductor fabrication as gate dielectrics, particularly for MOS devices. Two important semiconductor materials are silicon and germanium. The demand for high-k dielectrics has required manufacturers to augment existing oxide films (e.g., oxide films on silicon and germanium) by incorporating nitrogen into the oxide films. It is known in the art that nitrogen incorporation into the oxide films increases the dielectric constant of the resulting oxynitride film, and allows thinner gate dielectrics to be grown on these semiconductor substrate materials. The present invention provides methods of nitrogen incorporation that address the above-mentioned shortcomings associated with both the current sources of nitrogen and the methods of incorporating nitrogen into the oxide films.

Figure 1:
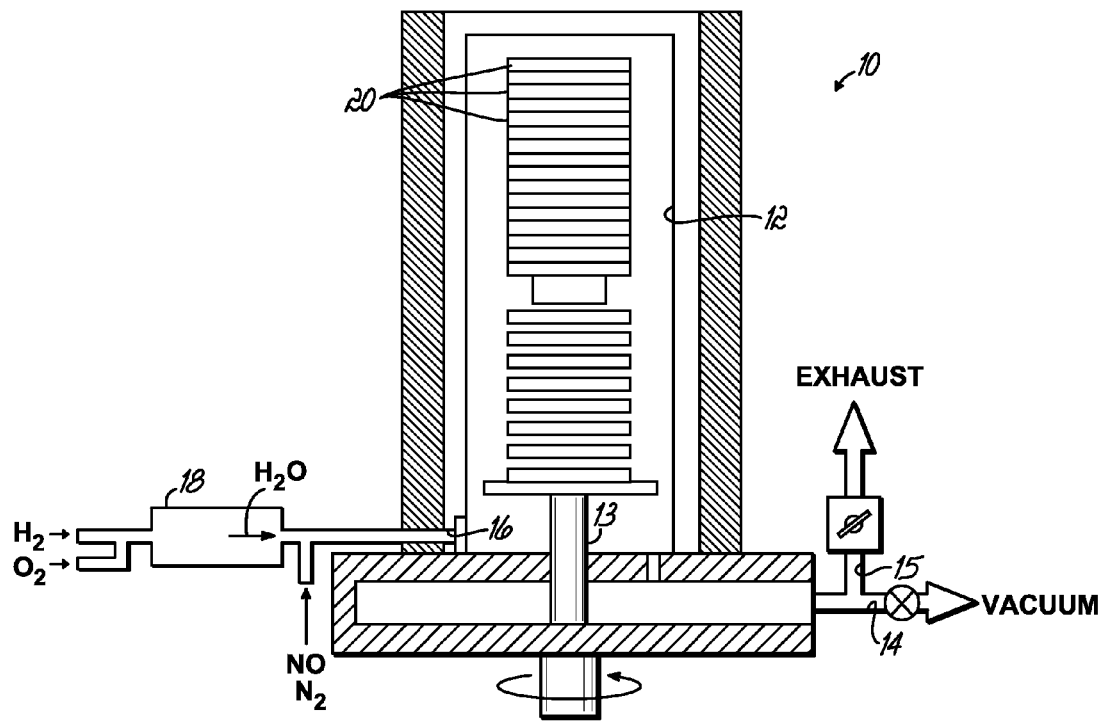
FIG. 1 schematically shows a cross-sectional view of a batch processing system configured to process a plurality of substrates according to an embodiment of the invention.
Figure 2:
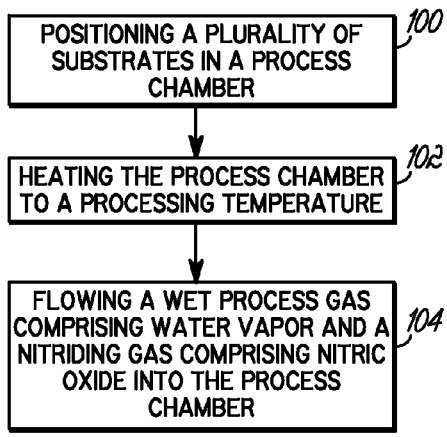
FIG. 2 shows a process flow diagram of one embodiment of the method of growing an oxynitride film on a substrate.

FIG. 1 shows a cross-sectional view of a batch processing system 10 having a process chamber 12 with a plurality of substrates 20 positioned within the process chamber 12. As one skilled in the art will observe, while a batch processing is shown and described, the method is also applicable to single substrate processing where the substrates are processed one at a time. FIG. 2 depicts a process flow diagram for forming an oxynitride film on the substrates 20 in FIG. 1.

Referring now to both FIGS. 1 and 2, in one embodiment of the method in 100, the plurality of substrates 20 are positioned in the process chamber 12. The substrate 20 may be positioned on a rotatable substrate holder 13. As one skilled in the art will observe, positioning or loading the substrates 20 within the batch processing system 10 may include exhausting the process chamber 12 through the exhaust port 15 and evacuating the process chamber 12 through a vacuum port 14 following insertion of the substrates 20. In addition, positioning the substrates 20 within the batch processing system 10 may also include purging the process chamber 12 with inert gas, such as nitrogen, to dilute or reduce the concentration of organic contaminants within the process chamber 12.

The process chamber 12 is then heated to a processing temperature, in 102. During heating of the process chamber 12, a heating rate may be from a few degrees per minute to 100 or more degrees per minute.

Following heating, in 104, a wet process gas is introduced into the process chamber 12 through an inlet port 16. The wet process gas comprises water ($H_2O$) vapor. Oxygen from the water vapor deposits onto the substrate 20 to thereby grow an oxide film on each of the substrates 20. Further in 104, subsequent to or substantially concurrently with flowing the wet process gas, a nitriding gas is introduced into the process chamber 12 through the inlet port 16. The nitriding gas comprises nitric oxide (NO) such that nitrogen from the nitric oxide is incorporated into the oxide film thereby forming an oxynitride film 30 on each of the substrates 20, as depicted on a single substrate 20 in FIG. 3. With further reference to FIGS. 1 and 2, while the heating of the process chamber 12 and flowing the wet process gas and the nitriding gas are described above in a particular order, heating the process chamber 12 and flowing any of the gases may occur in any order, and may depend upon the desired electrical performance of the oxynitride film 30. Now additional embodiments of the method will be described.

In one embodiment, the process chamber 12 is heated to a processing temperature greater than approximately 600° C. The nitrogen incorporation into the oxynitride film 30 at temperatures lower than 600° C. may be too slow. Therefore, at low temperatures, the process may not be cost effective. In addition, for some substrates 20, electrical properties quickly deteriorate at processing temperatures below 600° C. In another embodiment, the processing temperature is less than the temperature at which the substrates 20 deform or soften. Generally, the processing temperature is less than approximately 1100° C. In another embodiment, the processing temperature is from about 850° C. to about 1000° C. for cost effective manufacturing and high oxynitride film quality.

In one embodiment, once the process chamber 12 reaches the processing temperature, the wet process gas comprising water vapor and a nitriding gas comprising nitric oxide are introduced into the process chamber 12. Thus, the substrates 20 are surrounded by a processing ambient including the water vapor and the nitric oxide at the processing temperature. The processing ambient reacts with the substrates 20 to grow oxide films from the water vapor and with nitrogen from the nitric oxide being incorporated into the growing oxide films thus forming an oxynitride film 30 on each of the plurality of substrates 20, as shown on the single substrate 20 in FIG. 3.

In conjunction with the flow of the wet process gas and the nitriding gas, which creates the processing ambient, the processing ambient has a processing pressure. The processing pressure may range from atmospheric pressure to below 10 Torr. In one embodiment, the processing pressure is set in conjunction with the processing temperature to control a growth rate of the oxynitride film 30. One skilled in the art will observe that the processing pressure and the flow rates of the gases may change at any time during the oxynitride film growth. Therefore, the term "set" is not limited to a single act of setting the processing pressure, flow rates of gases, or processing temperature. Rather, set may refer to any number of settings or adjustments such that growing the oxynitride film 30 is in accordance with any quality standards either from internal controls, from industry, or determined by the customer.

According to one embodiment of the invention, prior to flowing the wet process gas into the process chamber 12, the wet process gas is generated external to the process chamber 12, as shown in FIG. 1, by combustion of a hydrogen gas ($H_2$) and an oxygen gas ($O_2$). One example of generating the wet process gas is with a high-dilution pyrogenic torch 18, as depicted in FIG. 1, developed by Tokyo Electron Ltd., Nirasaki, Yamanashi, Japan. The high-dilution pyrogenic torch 18 combusts small flows of hydrogen and oxygen. The pyrogenic torch 18 thus generates the wet process gas, i.e. water vapor in the form of steam, external to the process chamber 12. The wet process gas then flows into the process chamber 12, as shown in FIG. 1.

In one embodiment, the wet process gas and the nitriding gas flow substantially simultaneously into the process chamber 12. Therefore, nitrogen is incorporated into the oxynitride film 30 as it grows.

In another embodiment of the method, a diluting gas is used to dilute the wet process gas in the processing ambient. The ratio of the concentration of the diluting gas to the concentration of the wet process gas may influence the growth rate of the oxynitride film 30. Therefore, the diluting gas may be used to control the oxynitride film growth rate. In one embodiment, the diluting gas comprises nitrogen ($N_2$), as shown. However, other non-reactive gasses may be used, for example, argon. In another embodiment, flowing of the diluting gas into the process chamber 12 permits an oxynitride film 30 having a thickness of less than approximately 40 angstroms to be grown. In accordance with another embodiment of the present invention, by controlling the oxynitride film growth rate or the timing of the nitric oxide flow, a thin oxynitride film 30 may be grown having a nitrogen peak concentration 34 (FIG. 4A) at controlled locations. In one embodiment, the method grows oxynitride films with high nitrogen peak concentrations, for example greater than about 2 atomic %, without degrading the oxynitride film's electrical properties, such as an interface state density.

Figure 3:
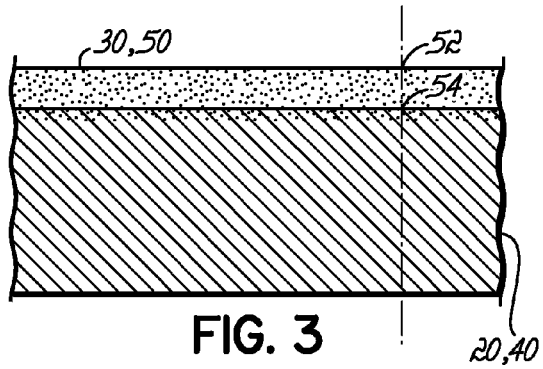
FIG. 3 is a cross-sectional view of the substrate with the oxynitride film grown according to one embodiment of the invention.

In another embodiment of the method, once the oxynitride film 30 is grown on each of the substrates 20 as illustrated in FIG. 3, the substrates 20 are annealed having the oxynitride films 30 thereon. As is known in the art, annealing the oxynitride film 30 on the substrate 20 may modify the properties of the device, particularly the film's electrical properties. In one embodiment of the method, during annealing, the processing ambient, the processing pressure and processing temperature, discussed above, are modified. For example, following flowing the wet process gas and the nitriding gas into the process chamber 12, the process chamber 12 may be vacuum purged one or more times to remove the processing ambient containing the wet process gas, the nitriding gas, and the diluting gas, if any, prior to annealing. Once purged of the processing ambient, an annealing gas may be introduced and an annealing temperature and an annealing pressure may be established within the processing chamber, which may require raising or lowering the temperature and/or pressure from the processing temperature and processing pressure. Alternatively, the substrates 20 having the oxynitride films 30 thereon may be transferred to a different treatment system for annealing. The annealing temperature and annealing pressure may have similar ranges as the processing temperature and processing pressure. According to one embodiment, the annealing gas comprises at least one of nitrogen, nitric oxide, nitrous oxide, oxygen, or water, or combinations thereof.

As previously mentioned, FIG. 3 shows a cross-sectional view of the substrate 20 and the oxynitride film 30 grown according to one embodiment of the method. By way of example, when the substrate 20 comprises silicon, referred to as silicon substrate 40, flowing the wet process gas and the nitriding gas into the process chamber 12 forms a silicon oxynitride film 50. As shown in FIG. 3, line "A" is drawn through the silicon oxynitride film 50 and into a silicon substrate 40. As one skilled in the art will appreciate, the composition of the silicon oxynitride film 50 varies from an external surface 52 of the silicon oxynitride film 50 to an interface 54 between the silicon oxynitride film 50 and the silicon substrate 40. For example, for the silicon oxynitride film 50, each of the oxygen, silicon, and nitrogen contents may vary along line A from the external surface 52 of the silicon oxynitride film 50 through the interface 54 between the silicon oxynitride film 50 and the silicon substrate 40. However, as one skilled in the art will appreciate, the "interface" 54 between the silicon substrate 40 and the silicon oxynitride film 50 is not abrupt, but may be described by a smooth, continuous reduction in oxygen concentration from the oxygen content of the silicon oxynitride film 50 to the oxygen content of the silicon substrate 40.

Figure 4A:
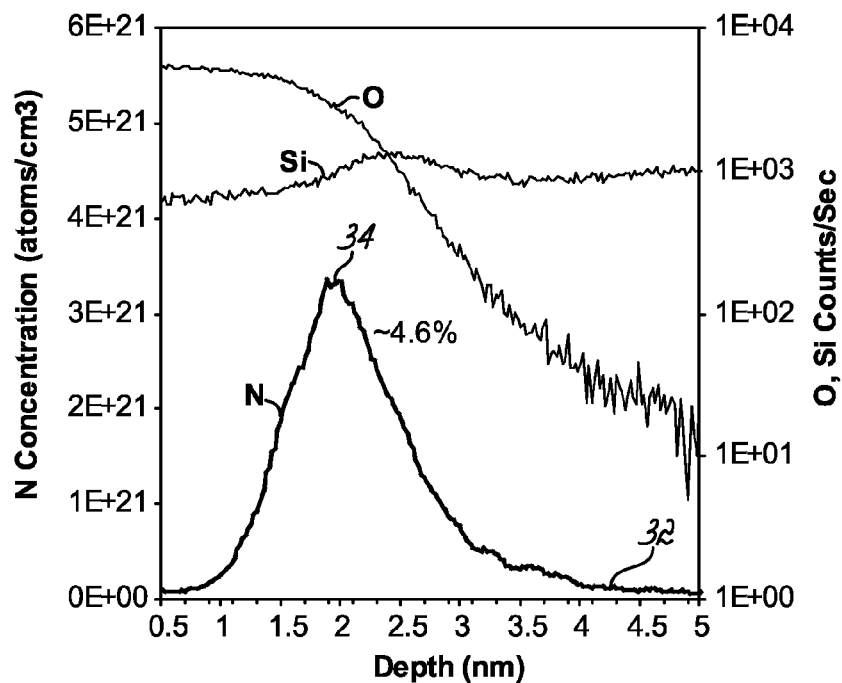
FIGS. 4A-4B show a Secondary Ion Mass Spectrometer (SIMS) plot and a capacitance-voltage curve, respectively, for a silicon oxynitride film grown according to one embodiment of the method.

FIG. 4A shows the secondary ion mass spectrometer (SIMS) plot of a silicon oxynitride film 50 grown according to one embodiment of the method of the present invention. With reference to FIG. 4A, three distinct concentration profiles are shown with respect to depth, as shown along the x-axis, into the silicon substrate 40. Referring once again to FIG. 3, the location where line A intersects the external surface 52 of the silicon oxynitride film 50 is approximately at the "0.5 nm" depth shown along the x-axis of FIG. 4A. Thus, proceeding downward along line A, i.e. deeper into the silicon oxynitride film 50, corresponds to moving right along the x-axis of FIG. 4A.

As previously mentioned, FIG. 4A shows three concentration profiles. One profile is for the nitrogen incorporated into the silicon oxynitride film 50, labeled "N." The other two are a silicon profile, labeled "Si," and an oxygen profile, labeled "O." The nitrogen profile 32 exhibits a peak 34 in concentration within the silicon oxynitride film 50 or silicon substrate 40. Thus, nitrogen incorporation is nearly zero at the external surface 52 of the silicon oxynitride film 50 with a maximum concentration of nitrogen, referred to herein as a nitrogen peak concentration 34, occurring below the external surface 52 of the silicon oxynitride film 50, again the external surface 52 being at approximately 0.5 nm.

The oxygen profile illustrates a decrease in oxygen counts per second with depth into the silicon oxynitride film 50. The silicon profile remains fairly constant across the SIMS plot. Determining the location of the interface between the silicon oxynitride film 50 and the silicon substrate 40 from the SIMS plot is generally performed with reference to the oxygen profile. When referred to herein, "interface" or "oxynitride film-substrate interface" refers to the depth where the oxygen counts per second falls to one-half of the oxygen content at the external surface of the silicon oxynitride film 50. Therefore, with respect to the SIMS plot of FIG. 4A, the interface 54 between the silicon oxynitride film 50 and the silicon substrate 40 occurs at a depth of approximately 2 nm. The nitrogen peak concentration 34 occurs at about the same depth. According to one embodiment of the method, the nitrogen peak concentration 34 is positioned at about the silicon oxynitride-to-silicon substrate interface 54. As previously mentioned, the method of the present invention enables the nitrogen profile 32 to be modulated, both in shape, including the nitrogen peak concentration 34 and width of the nitrogen profile 32, and in location with respect to the oxynitride film-substrate interface 54.

The flow rates of the wet process gas, the nitriding gas, and the diluting gas, if any, may range from 10 sccm (standard cubic centimeters per minute) to 20 slm (standard liters per minute) for wet process gas, 1 to 5000 sccm for the nitriding gas, and 100 sccm to 20 slm for the diluting gas. In accordance with the method of the present invention, a silicon oxynitride film 50 with the nitrogen, oxygen, and silicon profiles shown in FIG. 4A was grown on a silicon substrate 40 using the following flow rates and temperatures. The processing temperature was about 900° C., the processing pressure was about 670 Torr, the nitriding gas flow was about 1.41 slm, and the wet process gas flowed from the pyrogenic torch 18 to the process chamber 12 from an oxygen and hydrogen flow rate of about 0.2 slm each. The nitriding gas flowed for 15 minutes. The diluting gas was nitrogen having a flow rate of about 3.19 slm. The resulting silicon oxynitride film 50, having the SIMS plot, shown in FIG. 4A exhibited a nitrogen peak concentration 34 of between $3 \times 10^{21}$ (3E+21) and $4 \times 10^{21}$ (4E+21) atoms per cc (cubic centimeter) which equates to approximately 4.6 atomic % nitrogen, as shown. Moreover, the shape of the nitrogen profile 32 may be described by the area under the nitrogen profile 32, sometimes referred to as a nitrogen dose. The nitrogen dose processed accordingly was $4 \times 10^{14}$ (4E+14) atoms per cm$^2$.

Figure 4B:
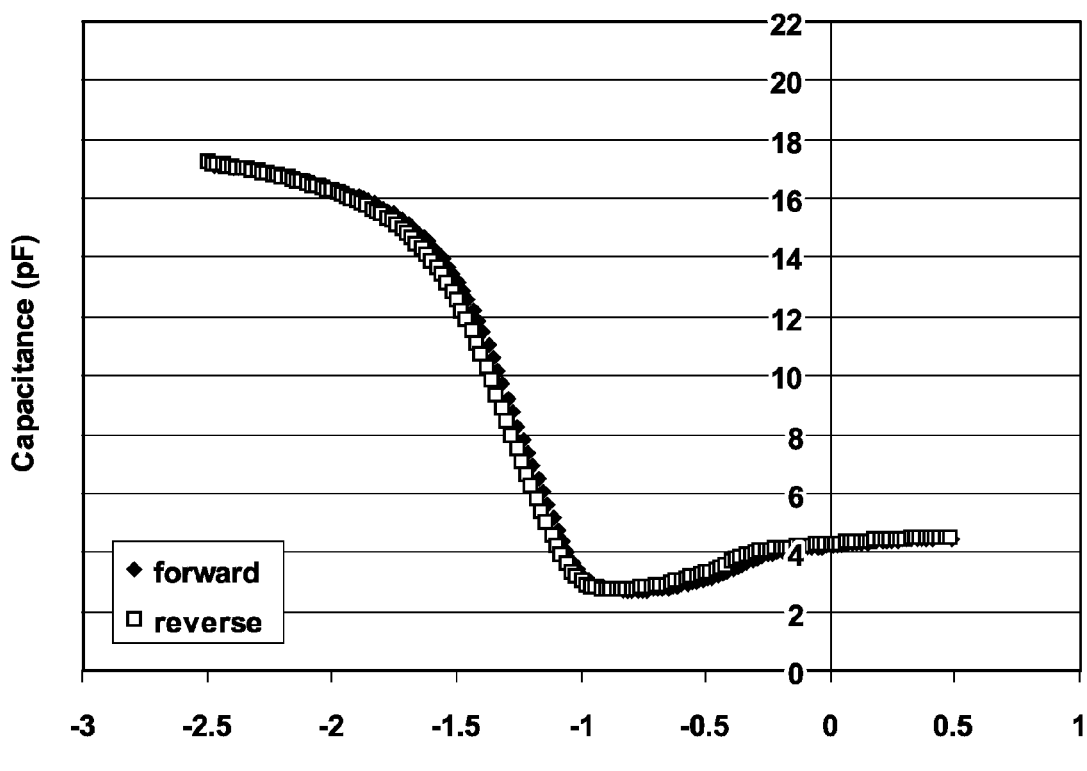

A capacitance-voltage (CV) curve is shown in FIG. 4B for the silicon oxynitride film 50 having the SIMS plot shown in FIG. 4A. This silicon oxynitride film 50 exhibited a dielectric constant of 4.4, a flatband voltage of −1.35 V, a $\Delta V_{fb}$ of 42.5 mV, and an interface trap density, or $D_{it}$, of $2.3 \times 10^{12}$ (2.3E+12) per cc.

Figure 5A:
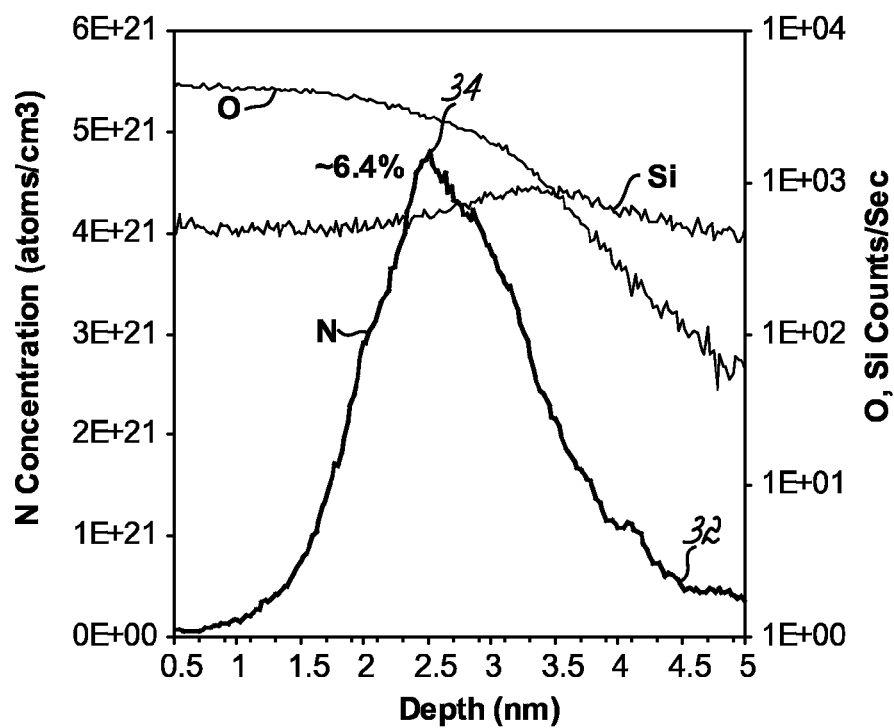
FIGS. 5A-5B show a SIMS plot and a capacitance-voltage curve, respectively, for a silicon oxynitride film grown according to yet another embodiment of the method.
Figure 5B:
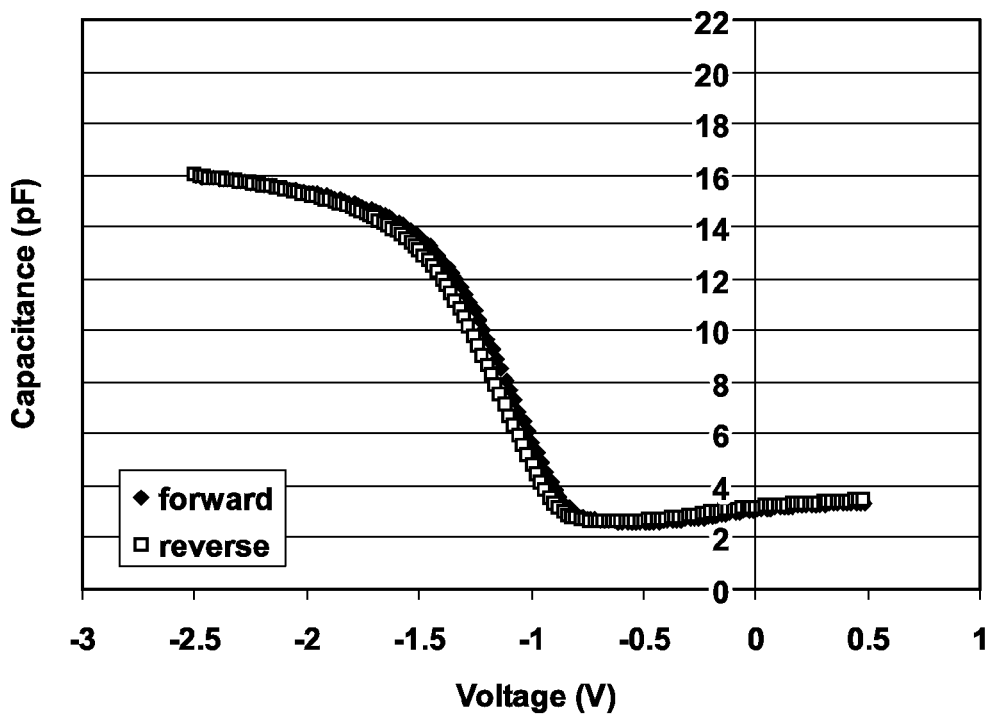

The silicon oxynitride film 50 with the SIMS plot shown in FIG. 4A was further processed according to another embodiment of the method of the present invention by annealing the silicon oxynitride film 50. In summary, FIGS. 5A and 5B show the concentration profiles and electrical properties of a silicon oxynitride film 50 grown by flowing wet process gas, nitriding gas, and diluting gas into the process chamber 12 having the silicon substrate 40 positioned therein at a processing temperature of 900° C. The nitriding gas was nitric oxide, the wet process gas was generated external to the process chamber 12 by flowing 0.2 slm of oxygen and 0.2 slm of hydrogen through the pyrogenic torch 18, and the diluting gas was $N_2$. Following flowing the nitriding gas, the wet process gas, and the diluting gas into the process chamber 12 for 15 minutes to grow the silicon oxynitride film 50, the silicon oxynitride film 50 was annealed. The annealing temperature was 900° C. The silicon oxynitride film 50 was held at that temperature for 30 minutes in an annealing gas comprising oxygen. FIG. 5A shows a nitrogen peak concentration 34 of approximately 6.4 atomic % at a depth of about 2.5 nm. The oxynitride film-substrate interface is at a depth of approximately 3 nm. Thus, in accordance with one embodiment of the invention, the nitrogen peak concentration 34 is in the silicon oxynitride film 50. Comparing the silicon oxynitride film 50 of FIGS. 4A to the annealed silicon oxynitride film 50 of FIG. 5A, by annealing the silicon oxynitride film 50 in oxygen, the nitrogen peak concentration 34 increased to about 6.4 atomic % from 4.6 atomic %. In addition, the nitrogen dose increased from $4.3 \times 10^{14}$ atoms per cm$^2$ to $8.2 \times 10^{14}$ atoms per cm$^2$.

FIG. 5B shows the CV curve for the oxygen annealed silicon oxynitride film 50 grown according to the method of the present invention discussed above with respect to FIG. 5A. Following annealing in the annealing gas containing oxygen, the dielectric constant decreased to 4.28, the flatband voltage was −1.21 V, the $\Delta V_{fb}$ was 60 mV, and the interface trap density was $1.47 \times 10^{12}$ per cc. Thus, by growing the silicon oxynitride film 50 according to the method of the invention, the nitrogen profile 32 may be modulated and nitrogen incorporation is significantly increased without deterioration of the electrical properties due to substantial nitrogen penetration into the silicon substrate 40.

Figure 6A:
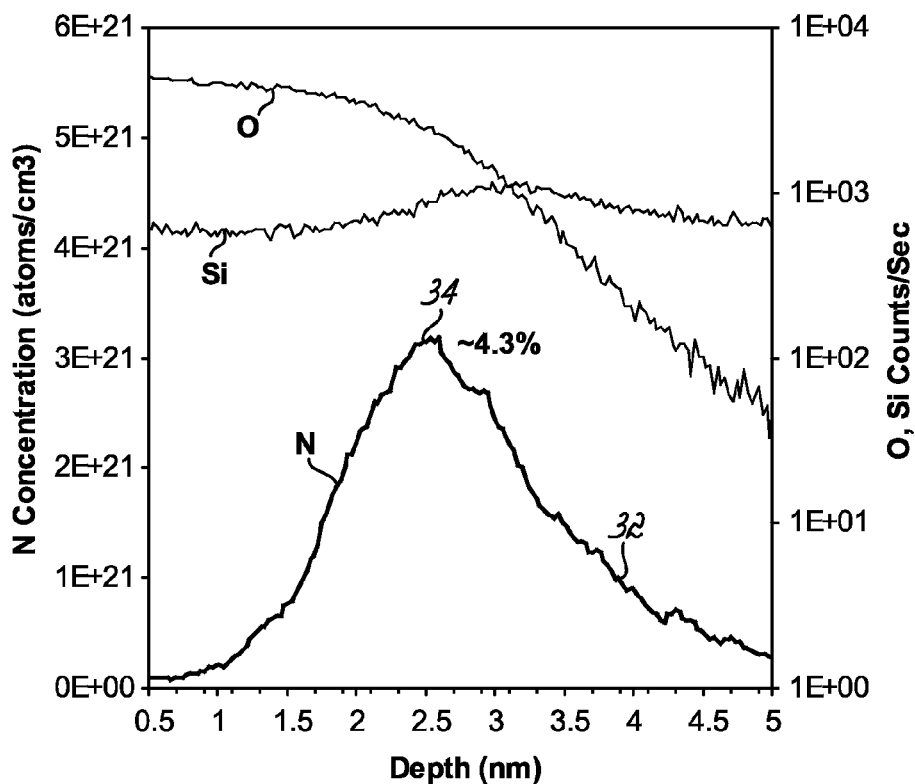
FIGS. 6A-6B show a SIMS plot and a capacitance-voltage curve, respectively, for a silicon oxynitride film grown according to one embodiment of the method.
Figure 6B:
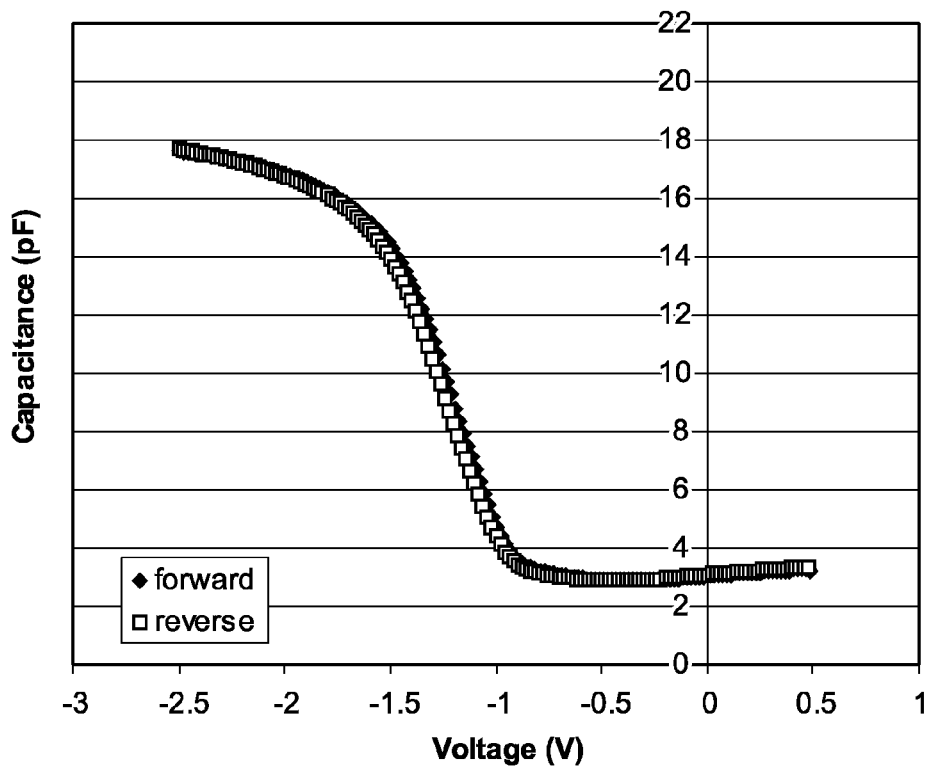

Another example of a silicon oxynitride film 50 grown according to one embodiment of the method has a nitrogen profile 32 and electrical properties as shown in FIGS. 6A and 6B. In this example, the flow of the diluting gas was increased from that used to grow the silicon oxynitride film 50 with the nitrogen profiles 32 as shown in FIGS. 4A and 5A. FIG. 6A shows a nitrogen profile 32 having a nitrogen peak concentration 34 of about 4.3 atomic % at a depth of about 2.5 nm and a nitrogen dose of about $6 \times 10^{14}$ atoms per cm$^2$. The oxynitride film-substrate interface is at a depth of approximately 2.75 nm. FIG. 6B shows the CV curve for the same silicon oxynitride film 50, which exhibited a dielectric constant of 4.44, a flatband voltage of −1.29V, a $\Delta V_{fb}$ of 33 mV, and an interface trap density of $0.75 \times 10^{12}$ per cc.

Figure 7A:
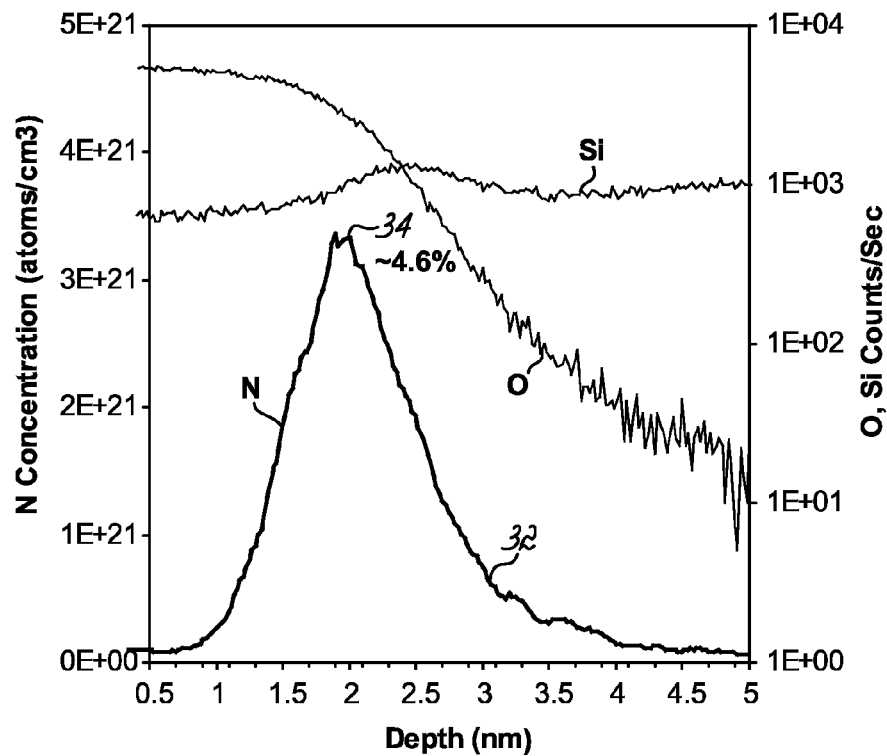
FIG. 7A shows a SIMS plot for a silicon oxynitride film grown according to one embodiment of the method.
Figure 7B:
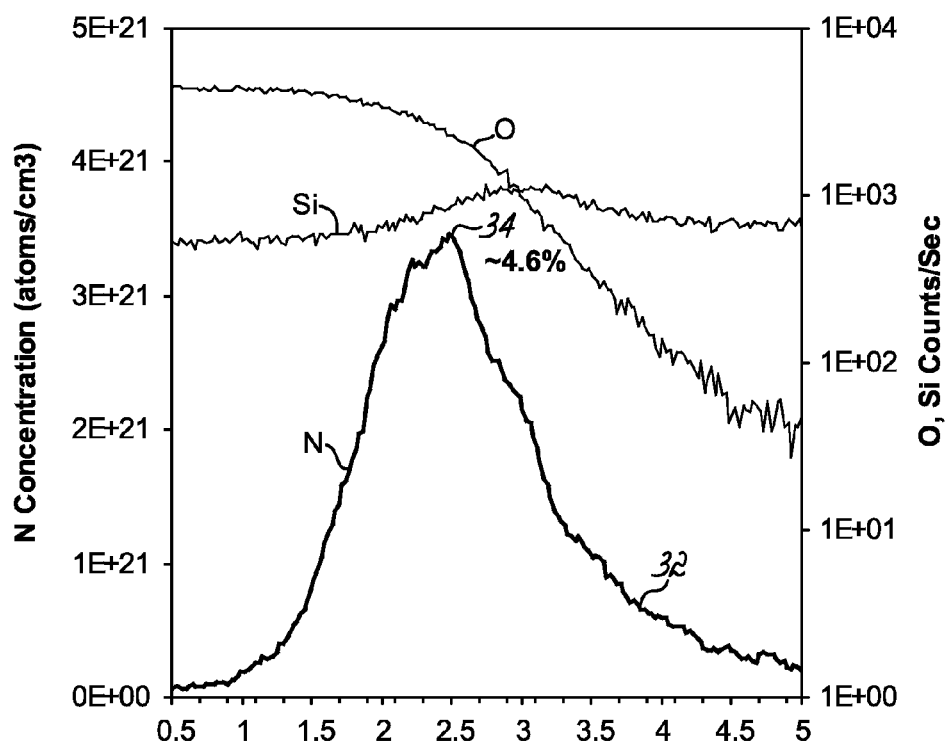
FIG. 7B shows a SIMS plot for the silicon oxynitride film shown in FIG. 7A following annealing for about 60 minutes in nitrogen.
Figure 7C:
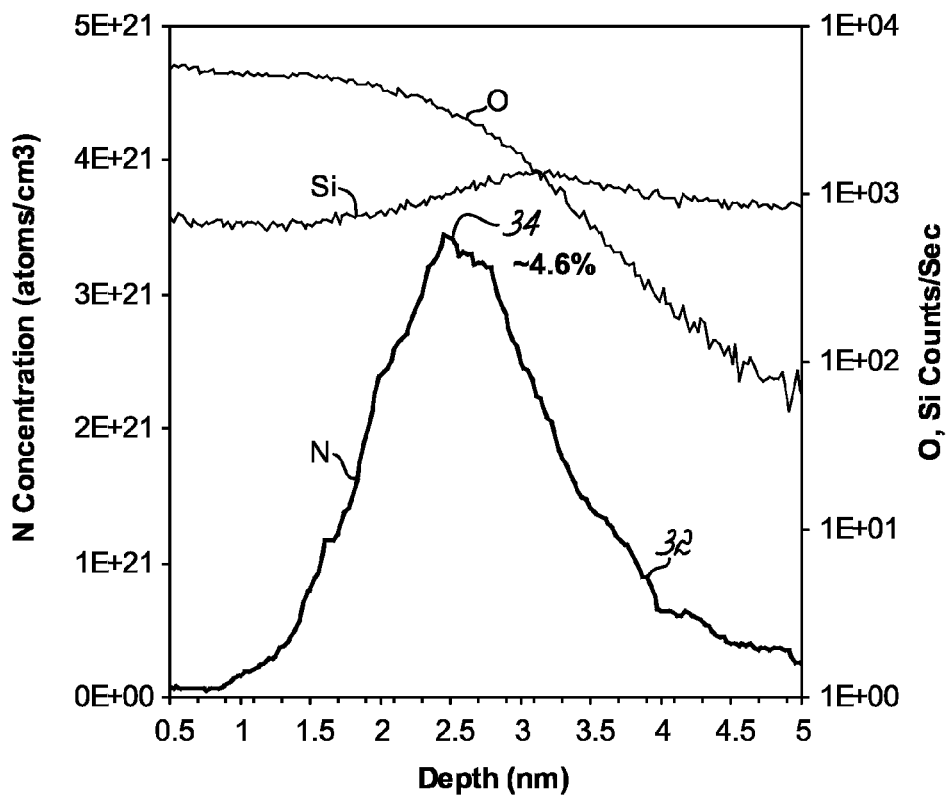
FIG. 7C shows a SIMS plot for the silicon oxynitride film shown in FIG. 7A following annealing for about 90 minutes in nitrogen.

FIGS. 7A, 7B, and 7C illustrate concentration profiles for another silicon oxynitride film 50 grown according to one embodiment of the present invention. In particular, FIG. 7A is a SIMS plot of the same silicon oxynitride film 50 with the SIMS plot shown in FIG. 4A, although on a slightly magnified scale, showing the nitrogen profile 32 in the silicon oxynitride film 50 grown within a processing ambient provided by the following flow rates. The flow rate of the oxygen and hydrogen gas into the pyrogenic torch 18 was 0.2 slm each. The flow rate of the nitric oxide into the processing chamber was 1.41 slm, and the flow rate of nitrogen was 3.19 slm. This silicon oxynitride film 50 had a nitrogen peak concentration 34 of 4.6 atomic % and a nitrogen dose of $4.3 \times 10^{14}$ atoms per cm$^2$. The oxynitride film-substrate interface was at a depth between approximately 2 and approximately 2.25 nm. FIG. 7B illustrates the effect of annealing the silicon oxynitride film 50 with the SIMS plot shown in FIG. 7A, in an annealing gas comprising nitrogen for about 60 minutes at about 900° C. The nitrogen peak concentration 34 remains about 4.6 atomic %, but the nitrogen dose increased to $5.6 \times 10^{14}$ atoms per cm$^2$. Thus, annealing in nitrogen increased the nitrogen dose from the as-grown silicon oxynitride film 50. Furthermore, continued annealing in nitrogen for 90 total minutes increased the nitrogen dose to $6 \times 10^{14}$ atoms per cm$^2$, as shown in FIG. 7C, with the nitrogen peak concentration 34 remaining at approximately 4.6 atomic %.

Figure 8A:
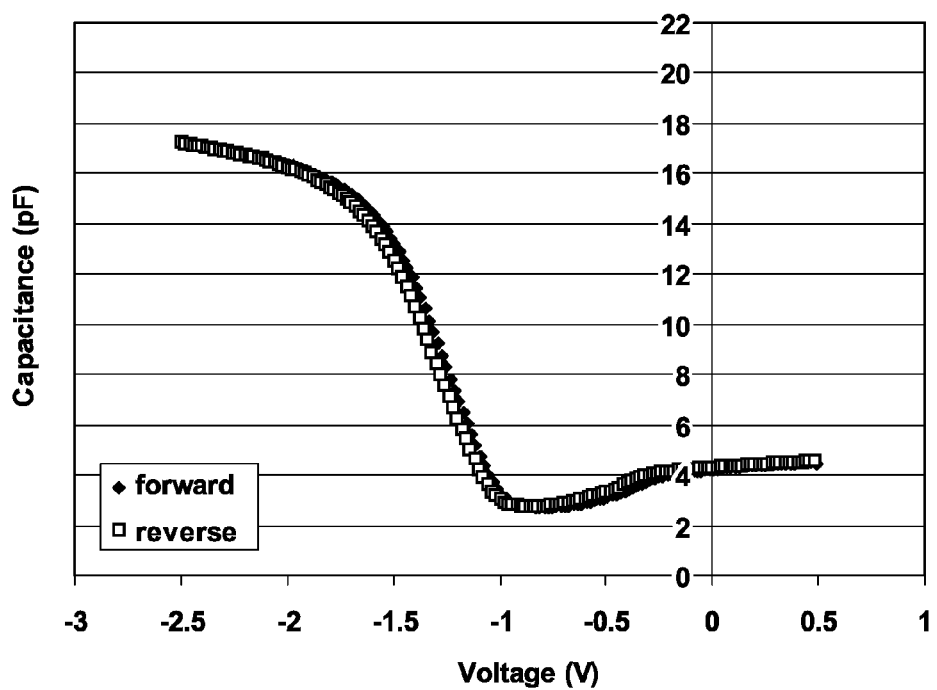
FIGS. 8A-8C show a capacitance-voltage curves for the silicon oxynitride films having the SIMS plots shown in FIG. 7A-7C, respectively.
Figure 8B:
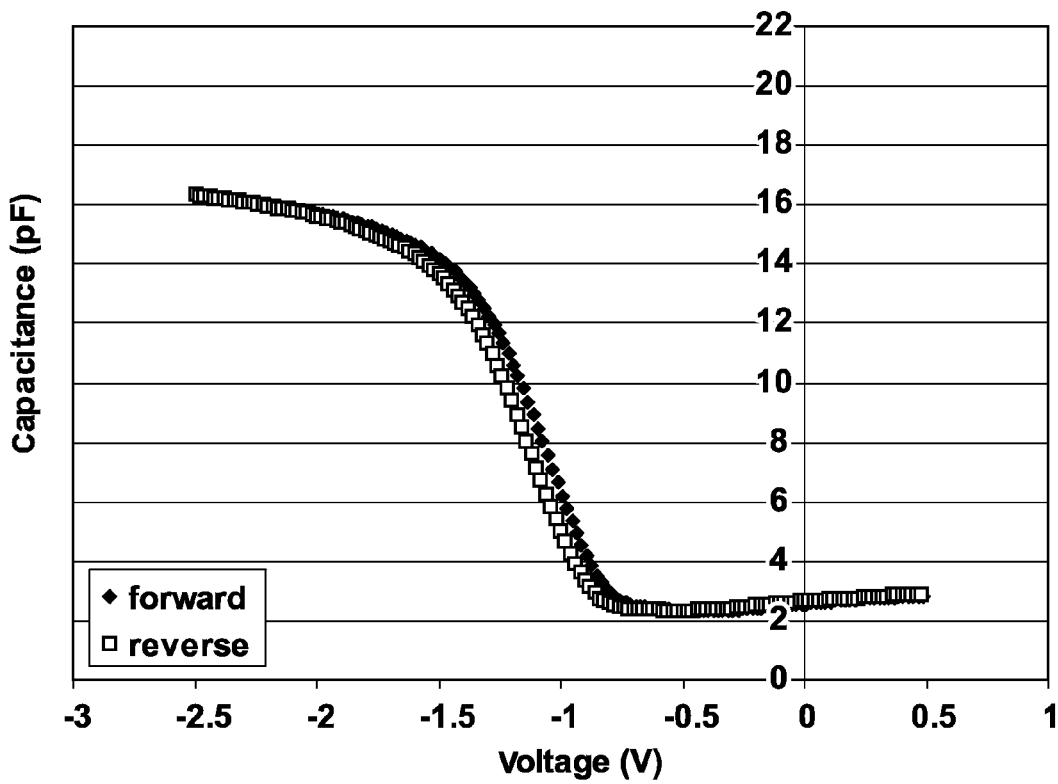
Figure 8C:
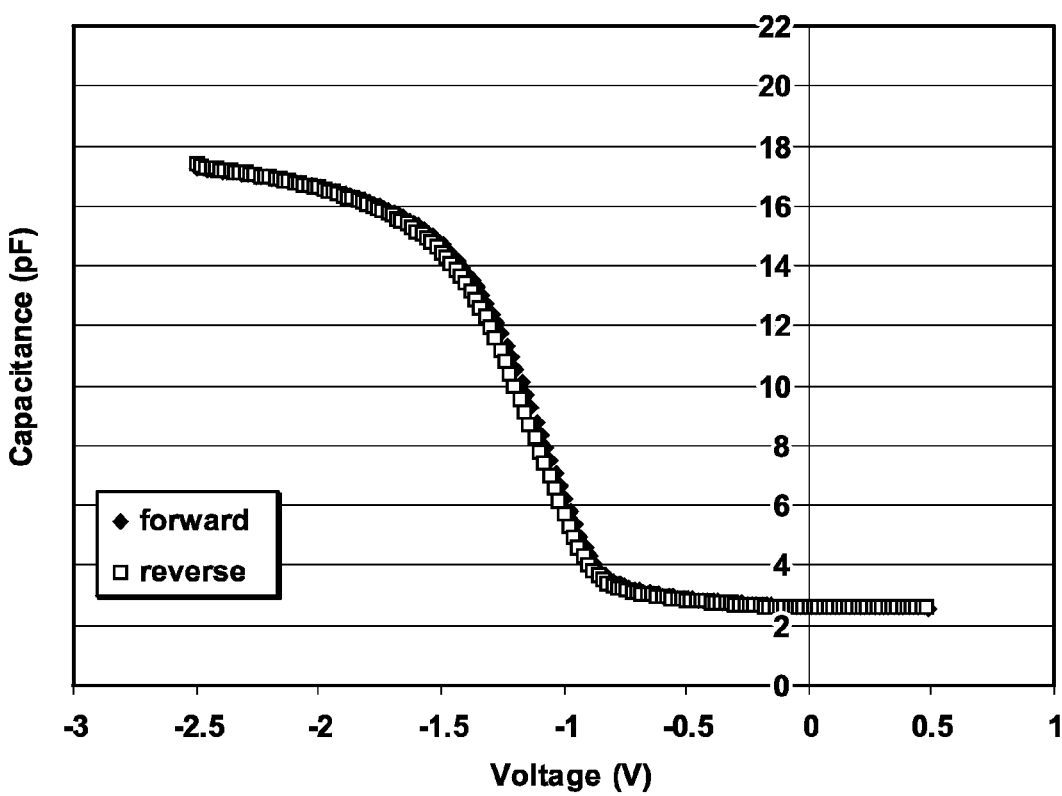

FIGS. 8A, 8B, and 8C illustrate the electrical properties for the silicon oxynitride films 50 corresponding to those with the SIMS plots shown in FIGS. 7A, 7B, and 7C, respectively. Thus, FIG. 8A shows a CV curve for the silicon oxynitride film 50 having the SIMS plot shown in FIG. 7A, which exhibited an interface state density of $2.3 \times 10^{12}$ per cc. After 60 minutes of annealing in an annealing gas comprising nitrogen at about 900° C., the interface state density decreased to $1.14 \times 10^{12}$ per cc, wherein the corresponding CV curve is shown in FIG. 8B. And, after 90 minutes of annealing in the annealing gas comprising nitrogen at about 900° C., the interface state density was $0.6 \times 10^{12}$ per cc and the dielectric constant was 4.51. The CV curve for the silicon oxynitride film 50 after 90 minutes of annealing in nitrogen is shown in FIG. 8C.

Figure 9:
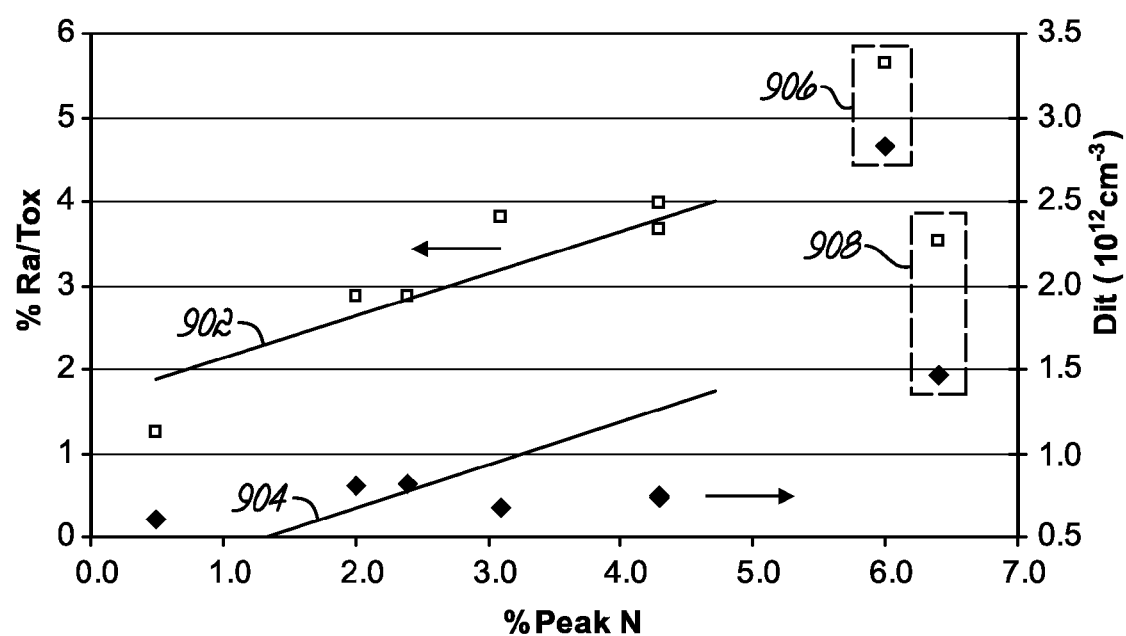
FIG. 9 shows a plot of the nitrogen peak concentration (% peak N) on the x-axis, with a surface roughness (% Ra/Tox) along the left y-axis and an interface state density ($D_{it}$(x $10^{12}$ per cc)) along the right y-axis for a number of oxynitride films grown according to embodiments of the invention with a comparison data set for a silicon oxynitride film grown according to another method.

FIG. 9 is a comparison of growing a silicon oxynitride film in a processing ambient emulating an N$_2$O nitridation process, as is known in the art, with growing the silicon oxynitride film 50 according to embodiments of the method of the present invention. FIG. 9 shows roughness (% Ra/Tox) and interface state density ($D_{it}$) of silicon oxynitride films 50 grown according to embodiments of the invention in curves 902 and 904, respectively. Furthermore, FIG. 9 shows a data set 906 for the prior art emulated N$_2$O nitridation process and a data set 908 for a silicon oxynitride film 50 grown using a processing ambient comprising a wet process gas and a nitriding gas followed by annealing in oxygen, according to one embodiment of the present invention. In particular, the silicon oxynitride films 50 grown according to embodiments of the method have low interface state densities. For example, the silicon oxynitride film 50 grown according to one embodiment of the present invention (data set 908) had a nitrogen peak concentration 34 in excess of 6 atomic %, had an interface state density (less than $1.5 \times 10^{12}$ per cc) that was significantly less than that of the silicon oxynitride film grown in the emulated N$_2$O environment (about $2.8 \times 10^{12}$ per cc in data set 906). In addition, FIG. 9 shows a comparison of the roughness (% Ra/Tox) of the silicon oxynitride film 50 grown according to one embodiment of the invention. The roughness was measured with an atomic force microscope (AFM). The silicon oxynitride film 50 grown according to embodiments of the invention is generally characterized as being more smooth than those grown by the emulated N$_2$O nitridation process, as shown.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention is therefore not limited to the specific details, representative apparatus and method and illustrative examples shown and described. For example, a silicon oxynitride film having a nitrogen peak concentration greater than approximately 0.5, 2, 4, 6, 10, or even greater than approximately 14 atomic % are contemplated. In one example, a silicon oxynitride film can have a nitrogen peak concentration between approximately 0.5 and approximately 14 atomic %. Accordingly, departures may be made from such details without departing from the scope of the general inventive concept.

What is claimed is:

1. A method for growing an oxynitride film on a substrate, the method comprising:
    positioning the substrate in a process chamber;
    heating the process chamber to a processing temperature;
    flowing a wet process gas comprising water vapor and a nitriding gas composed of nitric oxide substantially simultaneously into the process chamber; and reacting the substrate with the wet process gas and the nitriding gas at the processing temperature whereby an oxynitride film grows on the substrate.

2. The method of claim 1 further comprising generating the wet process gas external to the process chamber by combusting a hydrogen gas and an oxygen gas.

3. The method of claim 1 further comprising flowing a diluting gas into the process chamber while flowing the wet process gas to control a growth rate of the oxynitride film.

4. The method of claim 1 further comprising, after the reacting, annealing the substrate having the oxynitride film thereon in an annealing gas comprising at least one of nitrogen, nitric oxide, nitrous oxide, oxygen, or water, or combinations thereof.

5. The method of claim 1 wherein the processing temperature is between approximately 600° C. and approximately 1100° C.

6. The method of claim 1 wherein the processing temperature is greater than 850° C.

7. The method of claim 1 wherein the reacting grows the oxynitride film to a thickness of less than approximately 40 angstroms.

8. The method of claim 1 wherein the process chamber is in a batch processing system, and the positioning includes positioning a plurality of substrates in the process chamber whereby the oxynitride film grows on each of the plurality of substrates.

9. The method of claim 1 wherein the substrate comprises silicon whereby the reacting grows a silicon oxynitride film on the substrate.

10. The method of claim 9 wherein the substrate having the silicon oxynitride film thereon exhibits a nitrogen peak concentration of between approximately 0.5 and approximately 5 atomic %.

11. The method of claim 9 wherein the substrate having the silicon oxynitride film thereon exhibits a nitrogen peak concentration in the silicon oxynitride film.

12. A method for growing a silicon oxynitride film on a silicon substrate, the method comprising:
positioning the silicon substrate in a process chamber;
heating the process chamber to a processing temperature;
flowing a wet process gas comprising water vapor and a nitriding gas composed of nitric oxide into the process chamber;
controlling a ratio of the wet process gas to the nitriding gas; and
reacting the silicon substrate with the wet process gas and the nitriding gas at the processing temperature whereby the silicon oxynitride film grows on the silicon substrate with a nitrogen peak concentration in the silicon oxynitride film.

13. A method for growing a silicon oxynitride film on a substrate, the method comprising:
positioning the substrate in a process chamber, the substrate comprising silicon;
heating the process chamber to a processing temperature of at least 850° C.;
generating a wet process gas comprising water vapor external to the process chamber by combusting hydrogen and oxygen;
flowing the wet process gas, a diluting gas comprising nitrogen, and a nitriding gas composed of nitric oxide substantially simultaneously into the process chamber to react with the substrate, whereby a silicon oxynitride film grows on the substrate, the silicon oxynitride film having a nitrogen peak concentration of between approximately 0.5 atomic % and approximately 14 atomic %.

14. The method of claim 13 wherein the process chamber is in a batch processing system, and the positioning includes positioning a plurality of substrates in the process chamber whereby the oxynitride film grows on each of the plurality of substrates.

15. A method for growing an oxynitride film on a silicon substrate, the method comprising:
positioning the silicon substrate in a process chamber;
heating the process chamber to a processing temperature;
flowing a wet process gas comprising water vapor and a nitriding gas comprising nitric oxide substantially simultaneously into the process chamber, wherein the nitric oxide is supplied from a noncombusted source; and
reacting a surface portion of the silicon substrate with the wet process gas and the nitric oxide from the nitriding gas at the processing temperature to grow a silicon oxynitride film on the silicon substrate having a peak nitrogen concentration in the silicon oxynitride film.

16. The method of claim 15 further comprising generating the wet process gas external to the process chamber by combusting a hydrogen gas and an oxygen gas.

17. The method of claim 15 wherein the substrate having the silicon oxynitride film thereon exhibits a nitrogen peak concentration of between about 2 atomic % and about 14 atomic %.

18. The method of claim 15 wherein the substrate having the silicon oxynitride film thereon exhibits a nitrogen peak concentration of between about 4 atomic % and about 14 atomic %.

19. A method for growing an oxynitride film on a substrate, the method comprising:
positioning the substrate in a process chamber;
heating the process chamber to a processing temperature;
flowing a wet process gas comprising water vapor, a nitriding gas composed of nitric oxide, and a diluting gas substantially simultaneously into the process chamber; and
reacting the substrate with the wet process gas and the nitriding gas at the processing temperature whereby an oxynitride film grows on the substrate, wherein flowing the diluting gas while flowing the wet process gas controls a growth rate of the oxynitride film.

* * * * *